SEMICONDUCTOR DIODE UNITS

Filed July 16, 1968

INVENTOR
Raymond Patrick Siddell & Raymond West
BY Glascock, Downing & Seebold.
ATTORNEYS 3,548,267
Patented Dec. 15, 1970

3,548,267
SEMICONDUCTOR DIODE UNITS

Raymond Patrick Siddell, Sutton Coldfield, and Raymond West, Handsworth Wood, England, assignors to Joseph Lucas (Industries) Limited, Birmingham, England, a British company Filed July 16, 1968, Ser. No. 745,306
Claims priority, application Great Britain, Aug. 4, 1967, 35,952/67
Int. Cl. H01l *11/00, 15/00*
U.S. Cl. 317—234 1 Claim

ABSTRACT OF THE DISCLOSURE

A diode unit includes a pair of conductive parts between which a p-n semiconductor wafer is sandwiched. The parts are interconnected, but insulated from one another so as to constitute terminals to the two zones of the wafer, and each of the parts is formed with a necked portion so that the diodes can be mounted on a plate by passing the necked portion of one of the parts through a hole in the plate and then retaining the unit relative to the plate by a spring clip engaging the neck.

This invention relates to diode units.

A diode unit according to the invention comprises a pair of conductive parts between which a p-n semiconductor wafer is sandwiched, the parts being interconnected but insulated from one another so as to constitute terminals to the two zones of the wafer, and each of the parts being formed with a necked portion so that the diode can be mounted on a plate by passing the necked portion of one of the parts through a hole in the plate, and then retaining the unit relative to the plate by means of a spring clip engaging the neck of said one part.

Figure 2:
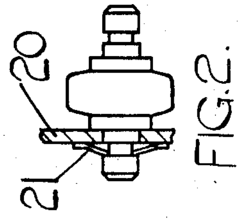
Figure 1:
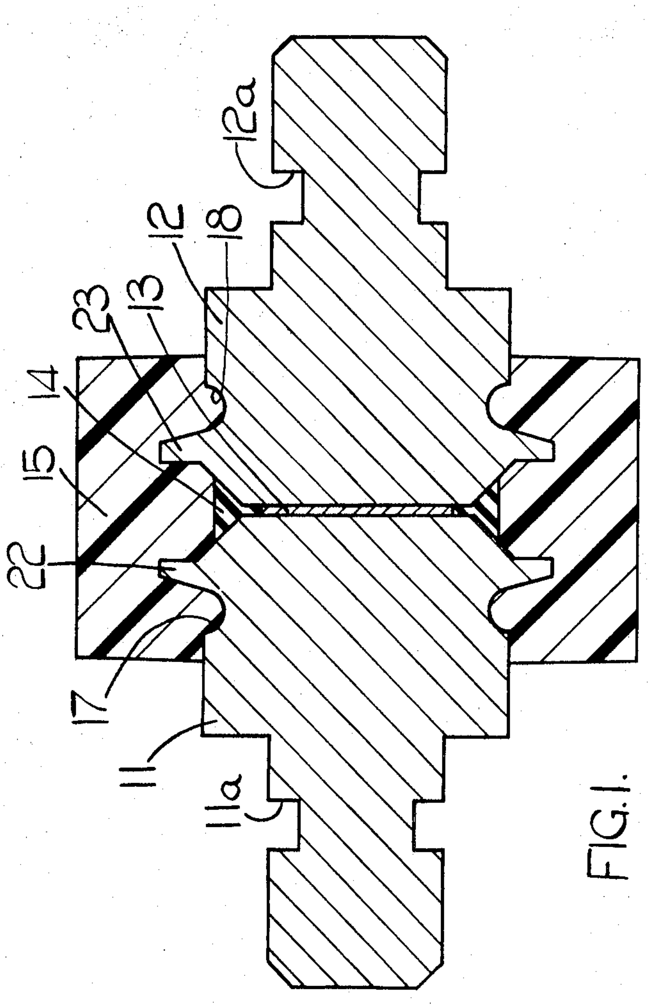

In the accompanying drawing, FIG. 1 is a part sectional side view illustrating one example of the invention, and FIG. 2 is a view showing the diode unit secured to a plate.

Referring to FIG. 1, there are provided a pair of identical conducting parts 11, 12 between which a p-n wafer 13 is sandwiched. The wafer 13 holds the parts 11, 12 in spaced relationship, and the adjacent faces of the parts 11, 12, are cut back at a point radially spaced from the wafer 13 to define a groove into which insulating material 14 is introduced to surround the edge of the wafer 13.

The parts 11, 12 are held in position by an insulating sleeve 15 which is moulded around the parts 11, 12 and is keyed in position by outwardly extending flanges 22, 23 and inwardly extending grooves 17, 18 on and in the parts 11, 12 respectively.

Each of the parts 11, 12 is formed with a neck 11*a*, 12*a*, and it will be appreciated that the parts 11, 12 constitute the connections to the two zones of the wafer 13.

The unit shown in FIG. 1 can be held in position relative to a conductive plate as shown in FIG. 2 by inserting one part 11 through the plate 20, so that the neck 11*a* is at the opposite side of the plate 20 from the remainder of the unit, and then engaging a spring washer 21 with the plate 20 and the neck to hold the unit in position. It will be appreciated that the unit can be mounted so that the positive or the negative terminal of the unit is connected to the plate 20.

Having thus described our invention what we claim as new and desire to secure by Letters Patent is:

1. A semiconductor diode unit adapted to be mounted on a member and comprising a pair of identical conductive parts between which a p-n semiconductor wafer is sandwiched, said wafer having a p zone and an n zone, means interconnecting said parts while insulating said parts from one another so that said parts constitute terminals to the two zones of the wafer, each of said parts comprising a first portion with said wafer sandwiched between said first portions and a second portion of reduced cross-section defining a first shoulder with said first portion, and each of said second portions having a recessed portion defining a second shoulder facing said first shoulder and spaced outwardly therefrom more than the thickness of the mounting member whereby either of said second portions may be passed through a hole in the mounting member and rigidly mounted thereon with the first shoulder thereof biased into clamped engagement against said mounting member by a spring clip compressed between the second shoulder of the second portion extending through the hole and the adjacent mounting member surface.

References Cited

UNITED STATES PATENTS

| | | | |
|---|---|---|---|
| 3,300,841 | 1/1967 | Fisher | 27—155.5 |
| 1,774,814 | 9/1930 | Reiter | 338—202X |
| 3,066,248 | 11/1962 | Miller | 317—234 |
| 2,798,137 | 7/1957 | Rasmussen | 201—48 |
| 2,814,705 | 11/1957 | Eshelman | 201—48 |
| 1,672,123 | 6/1928 | Hartranft | 338—202 |

JOHN W. HUCKERT, Primary Examiner
B. ESTRIN, Assistant Examiner

U.S. Cl. X.R.

174—52, 53; 317—235; 338—202, 318, 317